(12) United States Patent
Pang (10) Patent No.: US 10,741,786 B2
(45) Date of Patent: Aug. 11, 2020

(54) DISPLAY DEVICE HAVING AN AUXILIARY ELECTRODE

(71) Applicant: LG Display Co., Ltd., Seoul (KR)

(72) Inventor: Hee-Suk Pang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/131,922

(22) Filed: Sep. 14, 2018

(65) Prior Publication Data

US 2019/0097168 A1 Mar. 28, 2019

(30) Foreign Application Priority Data

Sep. 25, 2017 (KR) .................. 10-2017-0123490

(51) Int. Cl.
  *H01L 51/52* (2006.01)
  *H01L 51/56* (2006.01)
  *H01L 27/32* (2006.01)

(52) U.S. Cl.
  CPC ...... *H01L 51/5228* (2013.01); *H01L 27/3246* (2013.01); *H01L 27/3279* (2013.01); *H01L 51/524* (2013.01); *H01L 51/5212* (2013.01); *H01L 51/5253* (2013.01); *H01L 51/5284* (2013.01); *H01L 51/56* (2013.01); *H01L 2227/323* (2013.01)

(58) Field of Classification Search
  CPC .............................................. H01L 2227/323
  See application file for complete search history.

(56) References Cited

U.S. PATENT DOCUMENTS

| 7,554,116 | B2* | 6/2009 | Yamazaki | ........... H01L 27/3244 257/59 |
| 8,143,629 | B2* | 3/2012 | Arai | ...................... H01L 33/382 257/13 |
| 2003/0205708 | A1* | 11/2003 | Lee | ..................... H01L 27/3272 257/72 |
| 2004/0256620 | A1 | 12/2004 | Yamazaki et al. | |
| 2006/0001363 | A1* | 1/2006 | Park | ..................... H01L 27/3276 313/504 |
| 2007/0013828 | A1* | 1/2007 | Cho | .................. G02F 1/133308 349/65 |
| 2007/0018920 | A1* | 1/2007 | Jo | ........................ G09G 3/3225 345/88 |
| 2007/0181879 | A1* | 8/2007 | Lee | ..................... H01L 27/3246 257/59 |
| 2011/0186846 | A1 | 8/2011 | Ha et al. | |
| 2013/0306939 | A1 | 11/2013 | Park et al. | |
| 2017/0104009 | A1* | 4/2017 | Peng | ................... H01L 27/3276 |
| 2017/0117476 | A1* | 4/2017 | Kim | .................... H01L 51/5225 |
| 2017/0125506 | A1 | 5/2017 | Kim | |
| 2017/0250367 | A1* | 8/2017 | Yasukawa | ............. H01L 27/326 |

FOREIGN PATENT DOCUMENTS

| EP | 2 019 432 A2 | 1/2009 |
| EP | 2 031 658 A2 | 3/2009 |
| EP | 2 061 083 A1 | 5/2009 |

* cited by examiner

*Primary Examiner* — Thao P Le
(74) *Attorney, Agent, or Firm* — Seed IP Law Group LLP (57) ABSTRACT

A display device having an auxiliary electrode is provided. The display device may prevent the permeation of moisture through an over-coat layer exposing a portion of the auxiliary electrode. Thus, in the display device according to the embodiments of the present disclosure, the reliability may be improved.

14 Claims, 6 Drawing Sheets

DISPLAY DEVICE HAVING AN AUXILIARY ELECTRODE

CROSS-REFERENCE TO RELATED APPLICATION(S)

This application claims the priority benefit of Korean Patent Application No. 10-2017-0123490, filed on Sep. 25, 2017, which is hereby incorporated by reference as if fully set forth herein.

BACKGROUND

Technical Field

The present disclosure relates to a display device including an auxiliary electrode for preventing luminance unevenness due to a voltage drop.

Description of the Related Art

Generally, an electronic appliance, such as a monitor, a TV, a laptop computer and a digital camera, include a display device to realize an image. For example, the display device may include a liquid crystal display device or an organic light-emitting display device.

The display device may include a plurality of pixel areas. Each of the pixel areas may realize a specific color different from adjacent pixel areas. For example, the display device may include a blue pixel area realizing blue color, a red pixel area realizing red color, a green pixel area realizing green color, and a white pixel area realizing white color.

A light-emitting structure may be disposed on each pixel area of the display device. For example, the light-emitting structure may include a lower electrode, a light-emitting layer and an upper electrode, which are sequentially stacked. The upper electrode may be a common electrode. For example, in the display device, the upper electrode of the pixel area may be connected to the upper electrode of adjacent pixel area.

The display device may include an auxiliary electrode in order to prevent luminance unevenness due to a voltage drop. For example, the auxiliary electrode may extend between the pixel areas. The upper electrode may be connected to the auxiliary electrode. In the display device, various structures for connecting the upper electrode and the auxiliary electrode may be used. For example, a method of fabricating the display device may include a step of forming penetrating holes in insulating layers stacked on the auxiliary electrode for exposing a portion of the auxiliary electrode, and a step of removing a portion of the light-emitting layer which extends on the auxiliary electrode along the side surfaces of the penetrating holes using laser.

However, an over-coat layer, which removes the thickness difference due to technical features formed under the light-emitting structure among the insulating layers disposed on the auxiliary electrode, may include an organic insulating material relatively easy to permeate by moisture. Thus, in the display device, the moisture may permeate through the side surface of the hole penetrating the over-coat layer in order to expose a portion of the auxiliary electrode. Therefore, in the display device, the light-emitting layer stacked on the lower electrode may be deteriorated.

BRIEF SUMMARY

Accordingly, the present disclosure is directed to a display device that substantially obviates one or more problems due to limitations and disadvantages of the related art.

An embodiment of the present disclosure provides a display device capable of preventing deterioration of the light-emitting structure due to the over-coat layer.

Another embodiment of the present disclosure provides a display device capable of preventing the permeation of moisture through the side surface of the hole which penetrates the over-coat layer in order to expose a portion of the auxiliary electrode.

Additional advantages, embodiments, and features of the disclosure will be set forth in part in the description which follows and in part will become apparent to those having ordinary skill in the art upon examination of the following or may be learned from practice of the disclosure. The embodiments and other advantages of the disclosure may be realized and attained by the structure particularly pointed out in the written description.

To achieve these embodiments and other advantages and in accordance with the purpose of the disclosure, as embodied and broadly described herein, there is provided a display device including an auxiliary electrode on a lower substrate. An over-coat layer is disposed on the auxiliary electrode. The over-coat layer includes an over-coat penetrating hole overlapping with the auxiliary electrode. A bank insulating layer is disposed on the over-coat layer. The bank insulating layer exposes a portion of the auxiliary electrode. The bank insulating layer extends along a side surface of the over-coat penetrating hole.

The bank insulating layer may have a moisture absorption rate lower than that of the over-coat layer.

A lower passivation layer may be disposed between the lower substrate and the over-coat layer. The lower passivation layer may include a lower penetrating hole overlapping with the over-coat penetrating hole. The bank insulating layer may extend along a side surface of the lower penetrating hole.

The bank insulating layer may be in direct contact with the auxiliary electrode inside the lower penetrating hole.

A thickness of the bank insulating layer on the side surface of the lower penetrating hole may be smaller than a thickness of the bank insulating layer on the side surface of the over-coat penetrating hole.

An upper substrate may be disposed on the bank insulating layer and may extend on the exposed portion of the auxiliary electrode. A filler may be disposed between the bank insulating layer and the upper substrate. The filler may extend between the auxiliary electrode and the upper substrate. A portion of the upper substrate overlapping with the exposed portion of the auxiliary electrode may be in direct contact with the filler.

A light-emission layer may be disposed on the bank insulating layer. An upper electrode may be disposed on the light-emission layer. The light-emission layer and the upper electrode may extend on the exposed portion of the auxiliary electrode. The light-emitting layer may include an emission-layer penetrating hole overlapping the exposed portion of the auxiliary electrode. The upper electrode may be electrically connected to the auxiliary electrode through the emission-layer penetrating hole.

The auxiliary electrode may include an electrode protrusion expanding inside the emission-layer penetrating hole.

The bank insulating layer may include a bank penetrating hole overlapping with the auxiliary electrode. The over-coat penetrating hole may overlap with the bank penetrating hole. The horizontal width of the over-coat penetrating hole may be larger than the horizontal width of the bank penetrating hole at a lower surface of the over-coat layer facing the auxiliary electrode.

The center of the over-coat penetrating hole may be at the same position as the center of the bank penetrating hole.

The horizontal width of the lower penetrating hole at an upper surface of the lower passivation layer facing the over-coat layer may be smaller than the horizontal width of the over-coat penetrating hole at a lower surface of the over-coat layer facing the auxiliary electrode.

The bank insulating layer may include an end portion being in contact with the upper surface of the lower passivation layer in the over-coat penetrating hole.

A black matrix may be disposed on a lower surface of the upper substrate facing the bank insulating layer. The black matrix may extend on the auxiliary electrode.

The display device may further comprise a light-emission layer on the bank insulating layer and an upper electrode on the light-emission layer and, within the over-coat penetrating hole, the auxiliary electrode, the light-emission layer and the upper electrode may be jointly punctured by laser irradiation, and the punctured portion of the auxiliary electrode and the punctured portion of the upper electrode may be in electric contact by laser welding.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 1:
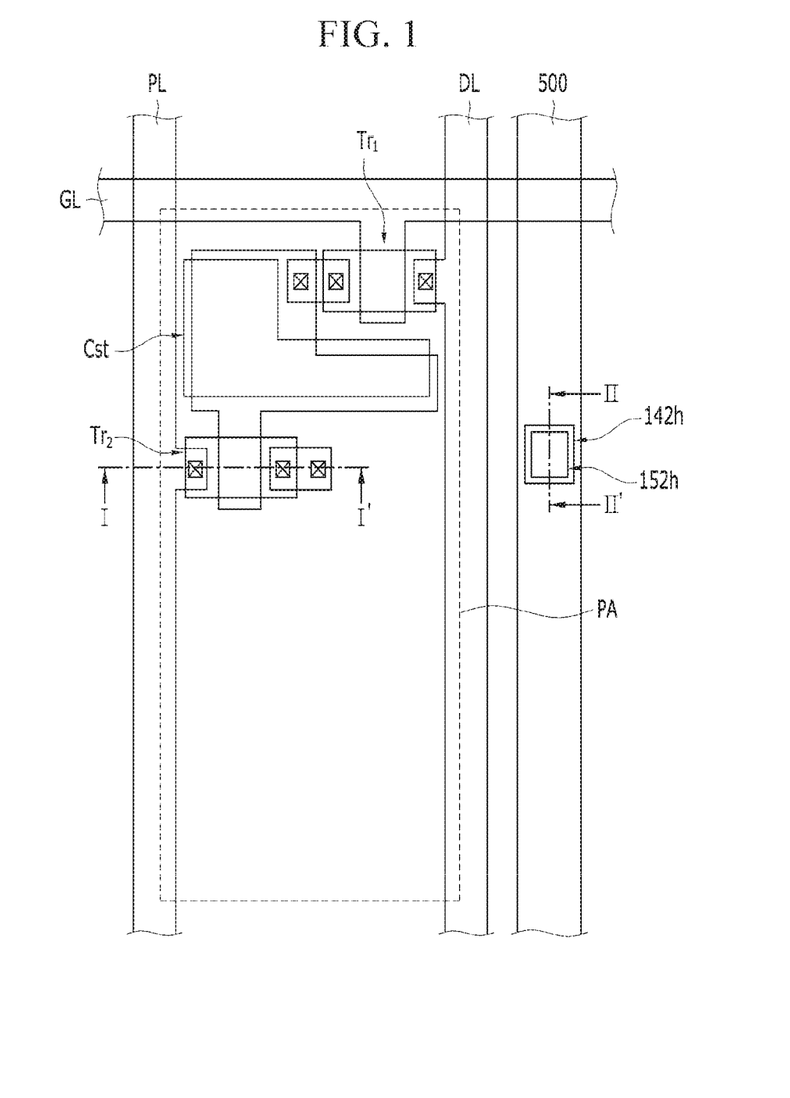
FIG. 1 is a view schematically showing a display device according to an embodiment of the present disclosure.
Figure 2:
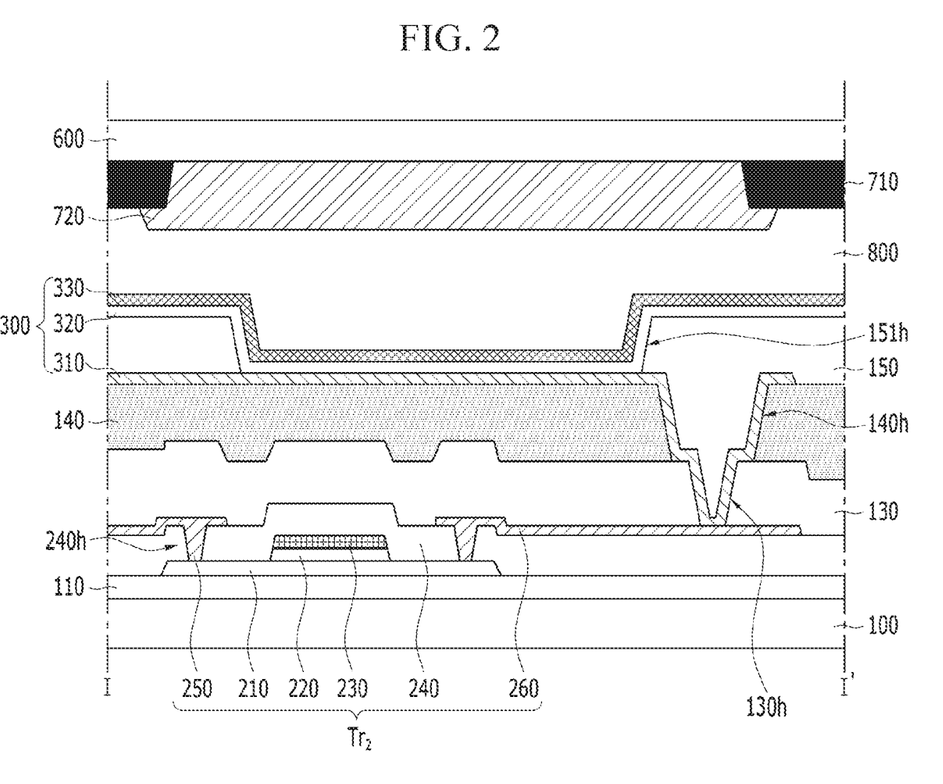
FIG. 2 is a view taken along I-I' of FIG. 1.
Figure 3:
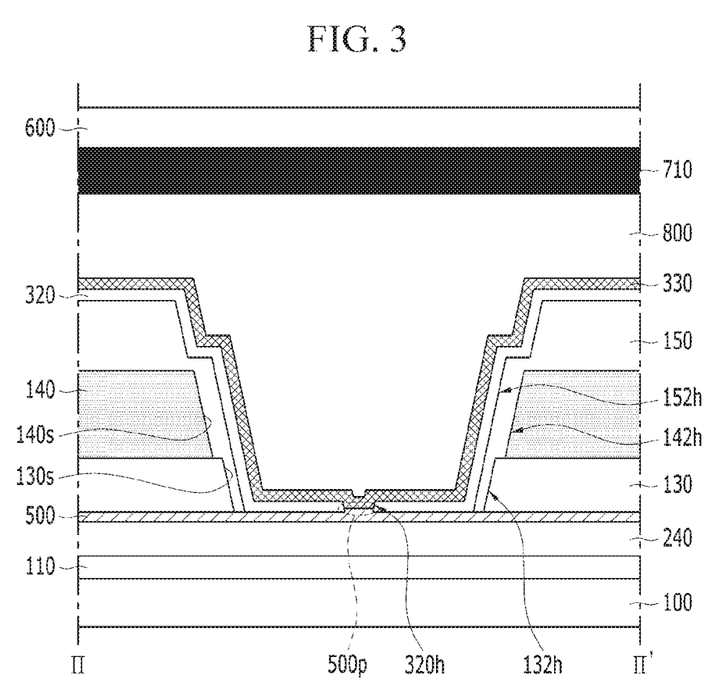
FIG. 3 is a view taken along II-II' of FIG. 1.

FIG. 1 is a view schematically showing a display device according to an embodiment of the present disclosure. FIG. 2 is a view taken along I-I' of FIG. 1. FIG. 3 is a view taken along II-II' of FIG. 1.

Referring to FIGS. 1 to 3, the display device according to the embodiment of the present disclosure may include a lower substrate 100, a thin film transistor Tr1 and Tr2, a lower passivation layer 130, an over-coat layer 140, a bank insulating layer 150, a light-emitting structure 300, an auxiliary electrode 500, an upper substrate 600 and a filler 800.

The lower substrate 100 may support the thin film transistor Tr1 and Tr2, the light-emitting structure 300 and the auxiliary electrode 500. The lower substrate 100 may include an insulating material. For example, the lower substrate 100 may include glass or plastic.

A gate line GL, a data line DL and a power supply line PL may be disposed on the lower substrate 100. The gate line GL may extend in a direction. The data line DL may intersect the gate line GL. The data line DL may be disposed in a layer different from the gate line GL. The power supply line PL may be parallel with the gate line GL or the data line DL. For example, the power supply line PL may be disposed in a same layer as the data line DL.

The gate line GL, the data line DL and the power supply line PL may define the pixel area PA. For example, the pixel area PA may be surrounded by the gate line GL, the data line DL and the power supply line PL. A driving circuit for controlling the light-emitting structure 300 may be disposed in the pixel area PA. For example, the driving circuit may include a selection thin film transistor Tr1, a driving thin film transistor Tr2 and a storage capacitor Cst.

The selection thin film transistor Tr1 may turn on/off the driving thin film transistor Tr2 according to a gate signal applied through the gate line GL. The driving thin film transistor Tr2 may supply driving current to the corresponding light-emitting structure 300 according to a signal of the selection thin film transistor Tr1. The storage capacitor Cst may maintain the signal of the selection thin film transistor Tr1 applied to the driving thin film transistor Tr2.

The driving thin film transistor Tr2 may have the same structure as the selection thin film transistor Tr1. For example, the driving thin film transistor Tr2 may include a semiconductor pattern 210, a gate insulating layer 220, a gate electrode 230, an interlayer insulating layer 240, a source electrode 250 and a drain electrode 260.

The semiconductor pattern 210 may be disposed close to the lower substrate 100. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include IGZO.

The semiconductor pattern 210 may include a source region, a drain region and a channel region. The channel region may be disposed between the source region and the drain region. The conductivity of the channel region may be lower than the conductivities of the source region and the drain region. For example, the source region and the drain region may include a conductive impurity.

The display device according to the embodiment of the present disclosure may further include a buffer layer 110 disposed between the lower substrate 100 and the semiconductor pattern 210. The buffer layer 110 may extend beyond the semiconductor pattern 210. For example, the buffer layer 110 may cover the entire surface of the lower substrate 100. The buffer layer 110 may include an insulating material. For example, the buffer layer 110 may include silicon oxide.

The gate insulating layer 220 may be disposed on the semiconductor pattern 210. The gate insulating layer 220 may include an insulating material. For example, the gate insulating layer 220 may include silicon oxide and/or silicon nitride. The gate insulating layer 220 may have a multi-layer structure. The gate insulating layer 220 may include a high-K material. For example, the gate insulating layer 220 may include hafnium oxide (HfO) or titanium oxide (TiO).

The gate electrode 230 may be disposed on the gate insulating layer 220. The gate electrode 230 may overlap the channel region of the semiconductor pattern 210. The gate electrode may be insulated from the semiconductor pattern 210 by the gate insulating layer 220. For example, the gate electrode 230 may include a side surface vertically aligned with a side surface of the gate insulating layer 220. The side surface of the gate insulating layer 220 may be continuous with the side surface of the gate electrode 230.

The gate electrode 230 may include a conductive material. For example, the gate electrode 230 may include a metal such as aluminum (Al), chrome (Cr), capper (Cu), titanium (Ti), molybdenum (Mo) and tungsten (W). The gate electrode 230 may have a multi-layer structure. The gate electrode 230 may include a material that is the same as a material of the gate line GL. The gate electrode 230 may be disposed on a layer that is the same as the gate line GL. For example, the structure of the gate line GL may be same as the structure of the gate electrode 230.

The interlayer insulating layer 240 may be disposed on the semiconductor pattern 210 and the gate electrode 230. The interlayer insulating layer 240 may extend beyond the semiconductor pattern 210. For example, the interlayer insulating layer 240 may be in contact with the buffer layer 110 at the outside of the semiconductor pattern 210. The interlayer insulating layer 240 may include an insulating material. For example, the interlayer insulating layer 240 may include silicon oxide.

The source electrode 250 and the drain electrode 260 may be disposed on the interlayer insulating layer 240. The source electrode 250 may be electrically connected to the source region of the semiconductor pattern 210. The drain electrode 260 may be electrically connected to the drain region of the semiconductor pattern 210. The drain electrode 260 may be spaced away from the source electrode 250. For example, the interlayer insulating layer 240 may include interlayer contact holes 240h exposing the source region or the drain region of the semiconductor pattern 210.

The source electrode 250 and the drain electrode 260 may include a conductive material. For example, the source electrode 250 and the drain electrode 260 may include a metal such as aluminum (Al), chrome (Cr), copper (Cu), titanium (Ti), molybdenum (Mo) and tungsten (W). The drain electrode 260 may include a material that is the same as a material of the source electrode 250. The source electrode 250 may have a multi-layer structure. The structure of the drain electrode 260 may be same as the structure of the source electrode 250. For example, the drain electrode 260 may have a multi-layer structure.

The source electrode 250 and the drain electrode 260 may include a material that is the same as a material of the data line DL and the power supply line PL. For example, the source electrode 250 and the drain electrode 260 may be disposed on a layer same as the data line DL and the power supply line PL. The data line DL and the power supply line PL may be disposed on the interlayer insulating layer 240. The structure of the data line DL and the structure of the power supply line PL may be same as the structure of the source electrode 250 and the structure of the drain electrode 260. For example, the data line DL and the power supply line PL may have a multi-layer structure.

The lower passivation layer 130 may be disposed on the thin film transistor Tr1 and Tr2. The lower passivation layer 130 may prevent damage of the thin film transistor Tr1 and Tr2 due to the outer moisture or impact. The lower passivation layer 130 may extend beyond the source electrode 250 and the drain electrode 260. For example, the lower passivation layer 130 may be in contact with the interlayer insulating layer 240 at the outside of the source electrode 250 and the drain electrode 260.

The lower passivation layer 130 may include an insulating material. For example, the lower passivation layer 130 may include silicon oxide and/or silicon nitride. The lower passivation layer 130 may have a multi-layer structure.

The over-coat layer 140 may be disposed on the lower passivation layer 130. The over-coat layer 140 may remove a thickness difference due to the thin film transistor Tr1 and Tr2. For example, an upper surface of the over-coat layer 140 opposite to the lower substrate 100 may be a flat surface. The upper surface of the over-coat layer 140 may be parallel with the surface of the lower substrate 100.

The over-coat layer 140 may include an insulating material. The over-coat layer 140 may include a material having a relatively higher liquidity. For example, the over-coat layer 140 may include an organic insulating material such as photo-acryl (PA).

The light-emitting structure 300 may realize a specific color. For example, the light-emitting structure 300 may include a lower electrode 310, a light-emission or light-emitting layer 320 and an upper electrode 330, which are sequentially stacked.

The light-emitting structure 300 may be controlled by the thin film transistors Tr1 and Tr2 of a corresponding driving circuit. For example, the lower electrode 310 of the light-emitting structure 300 may be electrically connected to a corresponding driving thin film transistor Tr2. The light-emitting structure 300 may be disposed on the over-coat layer 140. For example, the lower passivation layer 130 may include a lower contact hole 130h exposing the drain electrode 260 of the corresponding driving thin film transistor Tr2. The over-coat layer 140 may include an over-coat contact hole 140h overlapping with the lower contact hole 130h. The lower electrode 310 may be electrically connected to a corresponding drain electrode 260 through the lower contact hole 130h and the over-coat contact hole 140h.

The lower electrode 310 may include a conductive material. The lower electrode 310 may include a material having a high reflectance. For example, the lower electrode 310 may include a metal such as aluminum (Al) and silver (Ag). The lower electrode 310 may have a multi-layer structure. For example, the lower electrode 310 may have a structure in which a reflective electrode including a material having high reflectance is disposed between transparent electrodes including a transparent conductive material such as ITO and IZO.

The light-emitting layer 320 may generate light having luminance corresponding to a voltage difference between the lower electrode 310 and the upper electrode 330. For example, the light-emitting layer 320 may include an emission material layer (EML) having an emission material. The emission material may include an organic material, an inorganic material or a hybrid material. For example, the display device according to the embodiment of the present disclosure may be an organic light-emitting display device having an organic light-emitting layer 320.

The light-emitting layer 320 may have a multi-layer structure in order to increase luminous efficacy. For example, the light-emitting layer 320 may further include at least one of a hole injection layer (HIL), a hole transporting layer (HTL), an electron transporting layer (ETL) and an electron injection layer (EIL).

The upper electrode 330 may include a conductive material. The upper electrode 330 may have a structure different from the lower electrode 310. For example, the upper electrode 330 may be a transparent electrode. Thus, in the display device according to the embodiment of the present disclosure, the light generated by the light-emitting layer 320 may be emitted to the outside through the upper electrode 330.

The bank insulating layer 150 may cover an edge of the lower electrode 310. For example, the bank insulating layer 150 may include a bank opening 151h exposing a portion of the lower electrode 310. The light-emitting layer 320 and the upper electrode 330 may be sequentially stacked on the portion of the lower electrode 310 exposed by the bank opening 151h of the bank insulating layer 150. Thus, in the display device according to the embodiment of the present disclosure, the light-emitting structure 300 of each pixel area PA may be driven, independently.

The bank insulating layer 150 may include an insulating material. For example, the bank insulating layer 150 may include an organic insulating material. The bank insulating layer 150 may include a material different from the over-coat layer 140. The moisture absorbing rate of the bank insulating layer 150 may be lower than the moisture absorbing rate of the over-coat layer 140. For example, the bank insulating layer 150 may include poly-imide (PI).

The auxiliary electrode 500 may be disposed on the lower substrate 100. The auxiliary electrode 500 may be disposed at the outside of the pixel area PA. For example, the auxiliary electrode 500 may be disposed at the outside of the data line DL. The thin film transistor Tr1 and Tr2, and the storage capacitor Cst may be spaced away from the auxiliary electrode 500. The auxiliary electrode 500 may extend in a direction. For example, the auxiliary electrode 500 may be parallel with the data line DL.

The display device according to the embodiment of the present disclosure is described such that the auxiliary electrode 500 is a line type extending in a direction between adjacent pixel areas PA. However, in the display device according to another embodiment of the present disclosure, each pixel area PA may be surrounded by the auxiliary electrode 500. For example, the display device according to another embodiment of the present disclosure may include the mesh-shaped auxiliary electrode.

The auxiliary electrode 500 may include a conductive material. For example, the auxiliary electrode 500 may include a metal such as aluminum (Al), chrome (Cr), capper (Cu), titanium (Ti), molybdenum (Mo) and tungsten (W). The auxiliary electrode 500 may have a multi-layer structure.

The auxiliary electrode 500 may include a same material as one of conductive materials constituting the thin film transistor Tr1 and Tr2. For example, the auxiliary electrode 500 may include a material that is the same as a material of the source electrode 250 and the drain electrode 260. The structure of the auxiliary electrode 500 may be same as the structure of the source electrode 250 and the structure of the drain electrode 260. For example, the auxiliary electrode 500 may be formed simultaneously with the source electrode 250 and the drain electrode 260. The auxiliary electrode 500 may be disposed on the interlayer insulating layer 240. The lower passivation layer 130, the over-coat layer 140 and the bank insulating layer 150 may be stacked on the auxiliary electrode 500.

A penetrating hole 132h, 142h and 152h exposing a portion of the auxiliary electrode 500 may be disposed in the lower passivation layer 130, the over-coat layer 140 and the bank insulating layer 150. For example, the lower passivation layer 130 may include a lower penetrating hole 132h disposed on the auxiliary electrode 500. The over-coat layer 140 may include an over-coat penetrating hole 142h overlapping with the lower penetrating hole 132h. The bank insulating layer 150 may include a bank penetrating hole 152h exposing the portion of the auxiliary electrode 500.

The over-coat penetrating hole 142h may partially expose an upper surface of the lower passivation layer 130 facing the over-coat layer 140. For example, the horizontal width of the lower penetrating hole 132h at the upper surface of the lower passivation layer 130 may be smaller than the horizontal width of the over-coat penetrating hole 142h at a lower surface of the over-coat layer 140 facing the auxiliary electrode 500.

A side surface 130s of the lower penetrating hole 132h and a side surface 140s of the over-coat penetrating hole 142h may be positively tapered. The bank insulating layer 150 may extend along the side surface 130s of the lower penetrating hole 132h and the side surface 140s of the over-coat penetrating hole 142h. The side surface 130s of the lower penetrating hole 132h and the side surface 140s of the over-coat penetrating hole 142h may be covered by the bank insulating layer 150. The horizontal width of the over-coat penetrating hole 142h may be larger than the horizontal width of the bank penetrating hole 152h at the lower surface of the over-coat layer 140. The center of the over-coat penetrating hole 142h may be same as the center of the bank penetrating hole 152h. The bank penetrating hole 152h may have a gravity center the same as the over-coat penetrating hole 142h. For example, the bank penetrating hole 152h may be a polygonal shape having a same type as the over-coat penetrating hole 142h. The bank insulating layer 150 may be in contact with the auxiliary electrode 500 in the lower penetrating hole 132h. Thus, in the display device according to the embodiment of the present disclosure, the deterioration of the light-emitting layer 320 on the lower electrode 310 due to the permeation of moisture may be prevented.

In the display device according to the embodiment of the present disclosure, the upper electrode 330 may be electrically connected to the auxiliary electrode 500. For example, the light-emitting layer 320 and the upper electrode 330 may extend on the portion of the auxiliary electrode 500 exposed by the bank penetrating hole 152h. The light-emitting layer 320 disposed on the portion of the auxiliary electrode 500 exposed by the bank penetrating hole 152h may be separated from the light-emitting layer 320 disposed on the portion of lower electrode 310 exposed by the bank opening 151h of the bank insulating layer 150. The light-emitting layer 320 may include an emission layer hole 320h overlapping with the portion of the auxiliary electrode 500 exposed by the lower penetrating hole 132h. The upper electrode 330 may be in direct contact with the auxiliary electrode 500 at the inside of the emission layer hole 320h.

In the display device according to the embodiment of the present disclosure, the emission layer hole 320h may be formed by laser. For example, in the display device according to the embodiment of the present disclosure, the auxiliary electrode 500 may include an electrode protruding part 500p extending to the inside of the emission layer hole 320h.

The lower penetrating hole 132h may be formed by a same process as the lower contact hole 130h. The over-coat penetrating hole 142h may be formed simultaneously with the over-coat contact hole 140h. A process of forming the bank penetrating hole 152h may be performed after a process of forming the lower electrode 310. For example, the bank opening 151h and the bank penetrating hole 152h may be formed by a single process. A thickness of the bank insulating layer 150 on the side surface 140s of the over-coat penetrating hole 142h may be thicker than a thickness of the bank insulating layer 150 on the side surface 130s of the lower penetrating hole 132h. Thus, in the display device according to the embodiment of the present disclosure, the permeation of moisture through the side surface of the over-coat penetrating hole 142h may be prevented, efficiently.

The upper substrate 600 may be opposite to the lower substrate 100. For example, the upper substrate 600 may be disposed on the light-emitting structure 300. The upper substrate 600 may be disposed on the bank insulating layer 150. The upper substrate 600 may be disposed on the auxiliary electrode 500. The upper substrate 600 may extend on the portion of the auxiliary electrode 500 exposed by the bank penetrating hole 152h.

The upper substrate 600 may include an insulating material. The upper substrate 600 may include a transparent material. For example, the upper substrate 600 may include glass or plastic.

The display device according to the embodiment of the present disclosure may further comprise a black matrix 710 and a color filter 720 disposed on a lower surface of the upper substrate 600 facing the lower substrate 100. The color filter 720 may overlap the light-emitting structure 300. Thus, in the display device according to the embodiment of the present disclosure, the light generated by the light-emitting structure 300 may realize a specific color by the color filter 720. The black matrix 710 may prevent light from being emitted into unintended areas. For example, the black matrix 710 may overlap the auxiliary electrode 500.

The filler 800 may be disposed between the lower substrate 100 and the upper substrate 600. For example, a space between the upper electrode 330 of the light-emitting structure 300 and the color filter 720 may be filled by the filler 800. The filler 800 may fill a space between the bank insulating layer 150 and the black matrix 710. The filler 800 may flow into the bank penetrating hole 152h.

The filler 800 may include an insulating material. The filler 800 may include a transparent material. The filler 800 may include a curable material. For example, the filler 800 may include a thermosetting resin.

The display device according to the embodiment of the present disclosure is described such that the light-emitting structure 300 is in direct contact with the filler 800. However, the display device according to another embodiment of the present disclosure may further comprise an upper passivation layer on the light-emitting structure 300. The upper passivation layer may prevent damage of the light-emitting structure 300 due to the outer moisture and impact. The upper passivation layer may include an insulating material. For example, the upper passivation layer may have a structure in which an organic layer including an organic material is disposed between inorganic layers including an inorganic material.

Accordingly, in the display device according to the embodiment of the present disclosure, the side surface 140s of the over-coat penetrating hole 142h exposing the portion of the auxiliary electrode 500 may be covered by the bank insulating layer 150. Thus, in the display device according to the embodiment of the present disclosure, the permeation of moisture through the side surface 140s of the over-coat penetrating hole 142h overlapping with the auxiliary electrode 500, may be blocked. Therefore, in the display device according to the embodiment of the present disclosure, the deterioration of the light-emitting layer 320 due to the permeation of moisture may be prevented.

In the display device according to the embodiment of the present disclosure, the over-coat layer 140 may not overlap the portion of the auxiliary electrode 500 exposed by the bank penetrating hole 152h. Thus, when a laser beam is used to remove the light-emitting layer 320 formed on the portion of the auxiliary electrode 500, the laser does not damage the over-coat layer 140 and, thus, does not generate gas. Therefore, in the display device according to the embodiment of the present disclosure, the generation of a dark point due to gas and the degradation of the reliability may be prevented. Also, in the display device according to the embodiment of the present disclosure, a workable margin for a laser irradiation process may be increased.

Figure 4:
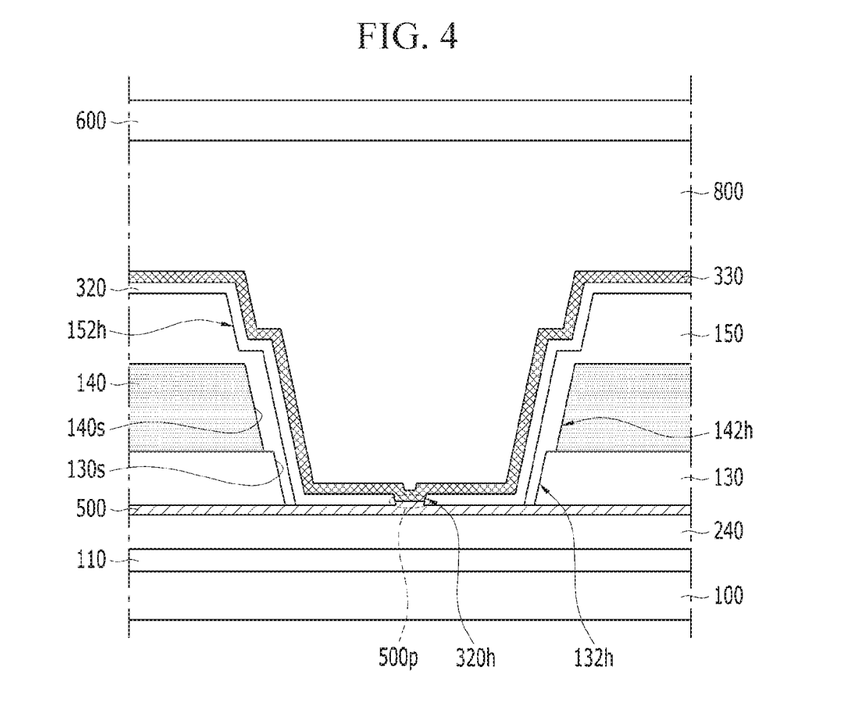
FIGS. 4 to 6 are views showing the display device according to another embodiment of the present disclosure.

The display device according to the embodiment of the present disclosure is described such that the black matrix 710 is disposed above the portion of the auxiliary electrode 500 exposed by the bank penetrating hole 152h. However, according to another embodiment of the present disclosure, the filler 800 may be in contact with the upper substrate 600 on the portion of the auxiliary electrode 500 exposed by the bank penetrating hole 152h, as shown in FIG. 4. Thus, in the display device according to this embodiment of the present disclosure, a laser for removing the light-emitting layer 320 formed on the portion of the auxiliary electrode 500 may be not illuminated to the black matrix 710. Thereby, in a display device according to this embodiment of the present disclosure, damage to the black matrix 710 due to laser and a degradation of the reliability due to the generation of gas may be prevented.

Figure 5:
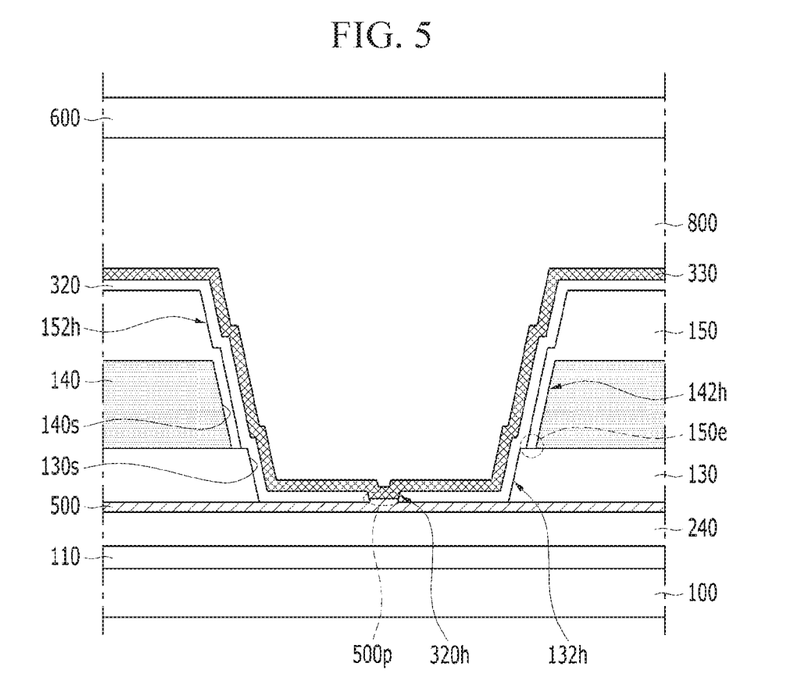

The display device according to the embodiment of the present disclosure is described such that the bank insulating layer 150 is in direct contact with the auxiliary electrode 500 in the lower penetrating hole 132h. However, in the display device according to another embodiment of the present disclosure, the bank insulating layer 150 may include an end portion 150e being in contact with the upper surface of the lower passivation layer 130 exposed by the over-coat penetrating hole 142h, as shown in FIG. 5. The lower passivation layer 130 may include a material having adhesion higher than the bank insulating layer 150. Thus, in the display device according to another embodiment of the present disclosure, the permeation of moisture through the side surface 140s of the over-coat penetrating hole 142h may be prevented, and the workable margin of a laser irradiation process for connecting the upper electrode 330 to the auxiliary electrode 500 may be improved.

Figure 6:
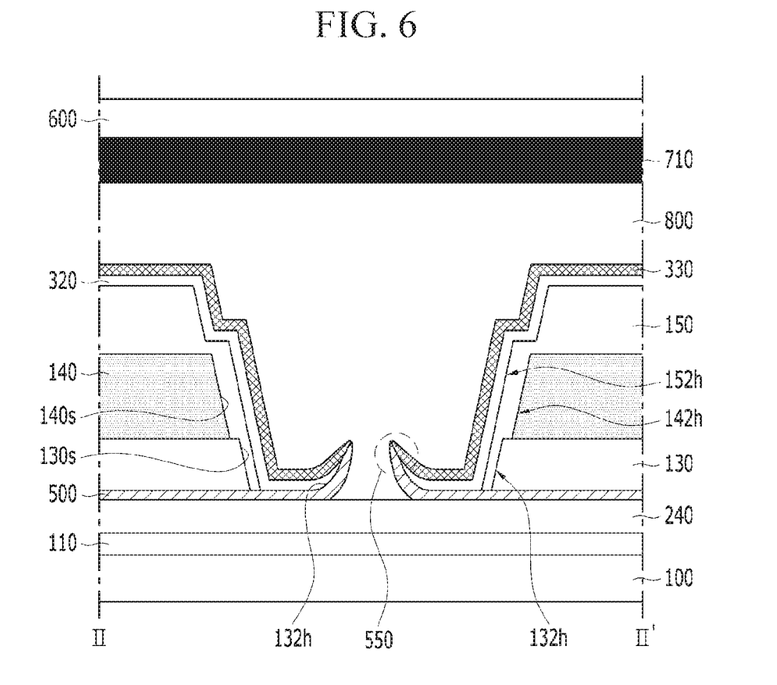

The display device according to the above embodiments of the present disclosure is described such that a lower surface of the auxiliary electrode 500 facing the lower substrate 100 is flat. However, according to another embodiment of the present disclosure, the auxiliary electrode 500 may have a portion 550 deformed by laser welding, as shown in FIG. 6. For example, portion 550 of the auxiliary electrode 500 may be punctured by laser irradiation and rolled up toward the upper substrate 600. Thus, in this embodiment of the present disclosure, the portion 550 of the auxiliary electrode 500 may be in side contact with the upper electrode 330, i.e., portion 550 of the auxiliary electrode 500 and the upper electrode 330 may be welded together owing to the laser irradiation. Therefore, the reliability of the electrical connection between the auxiliary electrode 500 and the upper electrode 330 may be increased by adjusting the irradiation condition of the laser.

In the result, the display device according to the embodiments of the present disclosure may include the bank insulating layer having a moisture absorbing rate relatively lower, disposed on the over-coat layer for exposing the portion of the auxiliary electrode, and extending on the side surface of the over-coat penetrating hole. Thus, in the display device according to the embodiments of the present disclosure, the permeation of moisture through the side surface of the over-coat penetrating hole may be blocked. Therefore, in the display device according to the embodiments of the present disclosure, the reliability may be improved.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
an auxiliary electrode on a lower substrate;
an over-coat layer on the auxiliary electrode, the over-coat layer including an over-coat penetrating hole overlapping with the auxiliary electrode;
a bank insulating layer on the over-coat layer, the bank insulating layer exposing a portion of the auxiliary electrode and extending along a side surface of the over-coat penetrating hole;
a light-emission layer on the bank insulating layer, the light-emission layer including an emission-layer penetrating hole overlapping with the exposed portion of the auxiliary electrode; and
an upper electrode on the light-emission layer, the upper electrode connected to the auxiliary electrode through the emission-layer penetrating hole.

2. The display device according to claim 1, wherein the bank insulating layer has a moisture absorption rate that is lower than a moisture absorption rate of the over-coat layer.

3. The display device according to claim 1, further comprising an upper substrate on the bank insulating layer, the upper substrate extending on the exposed portion of the auxiliary electrode.

4. The display device according to claim 3, further comprising a filler disposed between the bank insulating layer and the upper substrate, the filler extending between the auxiliary electrode and the upper substrate,
wherein a portion of the upper substrate overlapping with the exposed portion of the auxiliary electrode is in direct contact with the filler.

5. The display device according to claim 3, further comprising a black matrix on a lower surface of the upper substrate facing the bank insulating layer,
wherein the black matrix extends on the auxiliary electrode.

6. The display device according to claim 1, wherein the auxiliary electrode includes an electrode protruding part extending inside the emission-layer penetrating hole.

7. The display device according to claim 1, wherein the bank insulating layer includes a bank penetrating hole overlapping with the auxiliary electrode; and
the over-coat penetrating hole overlaps with the bank penetrating hole; and
a horizontal width of the over-coat penetrating hole is larger than a horizontal width of the bank penetrating hole at a lower surface of the over-coat layer facing the auxiliary electrode.

8. The display device according to claim 7, wherein a center of the over-coat penetrating hole is at a same position as a center of the bank penetrating hole.

9. A display device, comprising:
an auxiliary electrode on a lower substrate;
an over-coat layer on the auxiliary electrode, the over-coat layer including an over-coat penetrating hole overlapping with the auxiliary electrode;
a bank insulating layer on the over-coat layer, the bank insulating layer exposing a portion of the auxiliary electrode and extending along a side surface of the over-coat penetrating hole; and
a lower passivation layer disposed between the lower substrate and the over-coat layer,
wherein the lower passivation layer includes a lower penetrating hole overlapping with the over-coat penetrating hole, and
wherein the bank insulating layer extends along a side surface of the lower penetrating hole.

10. The display device according to claim 9, wherein the bank insulating layer is in direct contact with the auxiliary electrode in the lower penetrating hole.

11. The display device according to claim 9, wherein a thickness of the bank insulating layer on the side surface of the lower penetrating hole is smaller than a thickness of the bank insulating layer on the side surface of the over-coat penetrating hole.

12. The display device according to claim 9, wherein a horizontal width of the lower penetrating hole at an upper surface of the lower passivation layer facing the over-coat layer is smaller than a horizontal width of the over-coat penetrating hole at a lower surface of the over-coat layer facing the auxiliary electrode.

13. The display device according to claim 12, wherein the bank insulating layer includes an end portion in contact with the upper surface of the lower passivation layer inside the over-coat penetrating hole.

14. A display device, comprising:
- an auxiliary electrode on a lower substrate;
- an over-coat layer on the auxiliary electrode, the over-coat layer including an over-coat penetrating hole overlapping with the auxiliary electrode;
- a bank insulating layer on the over-coat layer, the bank insulating layer exposing a portion of the auxiliary electrode and extending along a side surface of the over-coat penetrating hole;
- a light-emission layer on the bank insulating layer; and
- an upper electrode on the light-emission layer, wherein, within the over-coat penetrating hole, the auxiliary electrode, the light-emission layer and the upper electrode comprise a joint puncture,
- wherein the joint puncture includes a punctured portion of the auxiliary electrode and a punctured portion of the upper electrode that are in electrical contact.

* * * * *